(12) United States Patent
Jeong et al.

(10) Patent No.: US 12,253,688 B2
(45) Date of Patent: Mar. 18, 2025

(54) SYSTEM FOR DRIVING ACTUATOR

(71) Applicant: LX SEMICON CO., LTD., Daejeon (KR)

(72) Inventors: Dong Gil Jeong, Daejeon (KR); Kyu Ho Kim, Daejeon (KR); Ho Yul Choi, Daejeon (KR); Chang In Park, Daejeon (KR)

(73) Assignee: LX Semicon Co., LTD, Daejeon (KR)

( * ) Notice: Subject to any disclaimer, the term of this patent is extended or adjusted under 35 U.S.C. 154(b) by 412 days.

(21) Appl. No.: 17/453,042

(22) Filed: Nov. 1, 2021

(65) Prior Publication Data

US 2022/0146850 A1    May 12, 2022

(30) Foreign Application Priority Data

Nov. 12, 2020 (KR) .................. 10-2020-0150716

(51) Int. Cl.
*H02M 1/44* (2007.01)
*G01R 7/00* (2006.01)
*G01R 19/00* (2006.01)
*G02B 27/64* (2006.01)
*G03B 5/00* (2021.01)
*G05F 1/00* (2006.01)
*H02P 6/14* (2016.01)
(Continued)

(52) U.S. Cl.
CPC ............. *G02B 27/646* (2013.01); *G01R 7/00* (2013.01); *G01R 19/0038* (2013.01); *G03B 5/00* (2013.01); *G05F 1/00* (2013.01); *H02P 25/034* (2016.02); *H04N 23/6812* (2023.01); *G03B 2205/0007* (2013.01); *G03B 2205/0015* (2013.01); *G03B 2205/0053* (2013.01); *G03B 2205/0069* (2013.01); *H04N 23/685* (2023.01)

(58) Field of Classification Search
CPC ...................................................... H02M 1/12
See application file for complete search history.

(56) References Cited

U.S. PATENT DOCUMENTS

| 2018/0083557 A1* | 3/2018 | Kurosawa .......... G11B 19/2009 |
| 2019/0154955 A1* | 5/2019 | Pang ....................... G03B 13/36 |
| 2021/0135616 A1* | 5/2021 | Hernandez ......... G05B 19/4155 |

FOREIGN PATENT DOCUMENTS

| KR | 10-2016-0087682 A | 7/2016 |
| KR | 10-2016-0126915 A | 11/2016 |

(Continued)

*Primary Examiner* — Kawing Chan
*Assistant Examiner* — Charles S Laughlin
(74) *Attorney, Agent, or Firm* — Greenberg Traurig, LLP; Allen Kim

(57) ABSTRACT

A system for driving an actuator which is capable of providing constant resolution regardless of a type of an actuator according to an aspect of the present invention includes an actuator driving circuit configured to generate a driving current for an operating actuator and output the generated driving current to the operating actuator, a current sensing unit configured to sense a current of the operating actuator and generate a sensing signal, and a gain adjustment unit configured to calculate a gain on the basis of a first maximum driving current range of the operating actuator and a second maximum driving current range of a reference actuator and change the sensing signal on the basis of the gain. A signal generated based on the second sensing signal is input to the actuator driving circuit.

16 Claims, 7 Drawing Sheets

(51) Int. Cl.
*H02P 25/034* (2016.01)
*H02P 27/14* (2006.01)
*H04N 23/68* (2023.01)

(56) References Cited

FOREIGN PATENT DOCUMENTS

KR     10-2002877 B1    7/2019
KR     10-2167778 B1    10/2020

\* cited by examiner

SYSTEM FOR DRIVING ACTUATOR

CROSS-REFERENCE TO RELATED APPLICATIONS

This application claims the benefit of the Korean Patent Application No. 10-2020-0150716 filed on Nov. 12, 2020, which is hereby incorporated by reference as if fully set forth herein.

FIELD

The present disclosure relates to a system for driving an actuator, and more specifically, to a system for driving an actuator which is capable of compensating for shaking.

BACKGROUND

Electronic devices in which a camera module is embedded may include an optical image stabilizer (OIS) to prevent shaking. An OIS may detect shaking and move a lens embedded in a camera module to prevent an image from shaking due to the shaking.

The OIS may move the lens using actuators, and current ranges for moving the lens at the same distance may be different depending on the actuators. Accordingly, the resolution of the OIS may vary depending on the actuator and a decrease in resolution may appear as a decrease in system performance.

SUMMARY

The present disclosure is designed to solve the above problems and is for providing a system for driving an actuator which is capable of providing constant resolution regardless of a type of an actuator.

An aspect of the present disclosure provides a system for driving an actuator including an actuator driving circuit configured to generate a driving current for an operating actuator and output the generated driving current to the operating actuator, a current sensing unit configured to sense a current of the operating actuator and generate a sensing signal, and a gain adjustment unit configured to calculate a gain on the basis of a first maximum driving current range of the operating actuator and a second maximum driving current range of a reference actuator and change the sensing signal on the basis of the gain. A signal generated based on the second sensing signal is input to the actuator driving circuit.

Another aspect of the present disclosure provides a system for driving an actuator including a shaking detector configured to detect shaking and generate a detection signal, a controller configured to generate a control signal for moving an operating actuator to a target position on the basis of the detection signal, and a driver configured to adjust a driving current by a first step driving current according to the control signal and move the operating actuator to the target position. The driver changes the first step driving current according to a first maximum driving current range of the operating actuator

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

In a case where 'comprise', 'have', and 'include' described in the present specification are used, another part may be added unless 'only~' is used. The terms of a singular form may include plural forms unless referred to the contrary.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or totally coupled to or combined with each other, and may be variously inter-operated and driven technically. The embodiments of the present disclosure may be carried out independently from each other or may be carried out together with a co-dependent relationship.

Hereinafter, exemplary embodiments of the present disclosure will be described with reference to the accompanying drawings.

Figure 1:
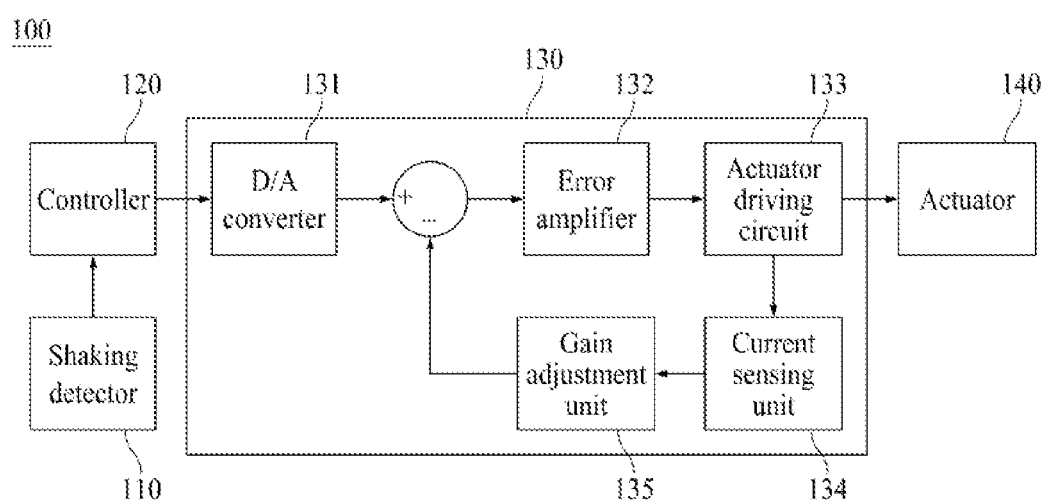
FIG. 1 is a block diagram illustrating a system for driving an actuator according to an embodiment of the present disclosure.

FIG. 1 is a block diagram illustrating a system for driving an actuator according to an embodiment of the present disclosure.

A system 100 for driving an actuator according to the embodiment of the present disclosure may be provided in an electronic device in which a camera module is embedded. In this case, the system 100 for driving an actuator may be embedded inside a camera module or inside an electronic device, such as a smartphone, on which a camera module is mounted.

The system 100 for driving an actuator according to the embodiment of the present disclosure includes a shaking detector 110, a controller 120, a driver 130, and an actuator 140, as illustrated in FIG. 1.

The actuator 140 may move a lens of a camera module based on a driving current output from the driver 130. Specifically, the actuator 140 may determine a moving distance of the lens according to an amount of driving current applied from the driver 130 and move the lens of the camera module in a predetermined moving direction according to the determined moving distance.

In an embodiment, the actuator 140 may include a voice coil motor (VCM). The VCM may move the lens of the camera module using a principle that a force is generated when a current flows through a coil in a magnetic field formed by a magnet.

The shaking detector 110 detects shaking of the camera module (not illustrated) or shaking of the electronic device on which the camera module is mounted and generates a detection signal. In an embodiment, the shaking detector 110 may be a gyro sensor. The gyro sensor is a motion sensor that detects shaking of a camera module and may detect the shaking of the camera module and output an angular velocity.

The controller 120 generates a control signal for controlling the actuator 140 so that the shaking detected by the shaking detector 110 is offset. Specifically, the controller 120 may detect a position of the actuator 140 or the lens (not illustrated). The controller 120 may determine a target position of the actuator 140 for moving the lens (not illustrated) of the camera module in an opposite direction of the shaking on the basis of the detected position. The controller 120 may generate a control signal for moving the actuator 140 to the target position. In this case, the controller 120 may generate a digital control signal.

The driver 130 adjusts the driving current according to the control signal input from the controller 120 and moves the actuator 140 to the target position. Specifically, the moving distance of the actuator 140 may be determined according to the driving current applied from the driver 130. The controller 120 may calculate the moving distance required to move the actuator 140 to the target position. In addition, the controller 120 may generate a control signal for allowing the driving current corresponding to the calculated moving distance to be applied to the actuator 140 and may output the control signal to the driver 130.

When the control signal is applied from the controller 120, the driver 130 may output the driving current corresponding to the control signal to the actuator 140. In this case, the driver 130 may change the driving current in units of steps. The driver 130 may output the driving current corresponding to the control signal to the actuator 140 while increasing or decreasing the driving current by a step driving current. Here, the step driving current may represent a size of a driving current range included in one step.

In the driver 130 according to the embodiment of the present disclosure, the step driving current may be changed according to a maximum driving current range of the actuator 140, and accordingly, the number of steps (or resolution) is constantly maintained regardless of a type of the actuator 140.

More specifically, the driver 130 according to the embodiment of the present disclosure may determine a first step driving current of an operating actuator 140 on the basis of a first maximum driving current range of the operating actuator 140, a second maximum driving current range of a reference actuator, and a second step driving current of the reference actuator.

Here, the operating actuator 140 corresponds to an actuator that is mounted in an actual electronic device to move a lens of a camera module. The first maximum driving current range corresponds to a maximum driving current range of the actuator mounted in the actual electronic device, and the first step driving current corresponds to a step driving current for the actuator mounted in the actual electronic device.

Meanwhile, the reference actuator corresponds to an actuator that is not actually mounted in an electronic device but serves as a reference for determining step driving currents for various types of actuators. The second maximum driving current range is a maximum driving current range of the reference actuator and may have a preset value. The second step driving current is a step driving current for the reference actuator and may have a preset value like the second maximum driving current range.

In an embodiment, the first step driving current of the operating actuator 140 may correspond to a value obtained by multiplying the second step driving current by a ratio of the first maximum driving current range of the operating actuator 140 to the second maximum driving current range of the reference actuator.

For example, it is assumed that the second maximum driving current range of the reference actuator is 10 mA, the second step driving current is 1 mA, and the first maximum driving current range of the operating actuator 140 is 5 mA. In this case, the first step driving current of the operating actuator 140 may correspond to a value obtained by multiplying 1 mA, which is the second step driving current, by 0.5, which is the ratio (5 mA/10 mA) of the first maximum driving current range of the operating actuator 140 to the second maximum driving current range of the reference actuator. That is, the first step driving current of the operating actuator 140 may be 0.5 mA.

Accordingly, the reference actuator and the operating actuator 140 may have the same resolution despite a difference in the maximum driving current range. Specifically, since the reference actuator has the second step driving current of 1 mA, the reference actuator may have ten steps up to 10 mA, which is the second maximum driving current range. Since the operating actuator 140 has the first step driving current of 0.5 mA, the operating actuator 140 may also have ten steps up to 5 mA, which is the first maximum driving current range.

As described above, the driver 130 according to the embodiment of the present disclosure has the same number of steps regardless of the types of actuators, and thus no resolution degradation may occur.

In order to have the same number of steps regardless of the types of actuators as described above, the driver 130 includes a digital-to-analog converter 131, an error amplifier 132, an actuator driving circuit 133, a current sensing unit 134, and a gain adjustment unit 135.

The digital-to-analog converter 131 converts a digital control signal for moving the operating actuator 140 to a target position into an analog control signal. Specifically, the digital-to-analog converter 131 may receive a digital control signal for moving the operating actuator 140 to the target position from the controller 120.

The digital-to-analog converter 131 may convert the digital control signal into an analog voltage and output the converted analog voltage. In this case, the digital-to-analog converter 131 may output the analog voltage while increasing the analog voltage by a voltage value corresponding to a step current. Here, the step current of the digital-to-analog converter 131 may be identical to the second step driving current of the reference actuator.

For example, when the second step driving current of the reference actuator is 1 mA, the step current of the digital-to-analog converter 131 may also be 1 mA. The digital-to-analog converter 131 may increase the analog voltage by a voltage value corresponding to 1 mA.

The current sensing unit 134 senses a current of the operating actuator 140. In an embodiment, the current sensing unit 134 may sense a current flowing through a coil included in the operating actuator 140. In another embodiment, the current sensing unit 134 may sense a current output from the actuator driving circuit 133.

Meanwhile, the current sensing unit 134 may generate a first sensing signal by converting the sensed current into a voltage.

The gain adjustment unit 135 calculates a gain on the basis of the first maximum driving current range of the operating actuator 140 and the second maximum driving current range of the reference actuator and converts the first sensing signal into a second sensing signal on the basis of the calculated gain. Here, the first sensing signal may correspond to a value sensed by the current sensing unit 134 and the second sensing signal may correspond to a value obtained by reflecting the gain to the first sensing signal.

Specifically, the gain adjustment unit 135 may calculate a ratio of the second maximum driving current range of the reference actuator to the first maximum driving current range of the operating actuator 140 as the gain. The gain adjustment unit 135 may multiply the first sensing signal generated by the current sensing unit 134 by the calculated gain to convert the first sensing signal into the second sensing signal.

For example, it is assumed that the second maximum driving current range of the reference actuator is 10 mA and the first maximum driving current range of the operating actuator 140 is 5 mA. In this case, the gain adjustment unit 135 may calculate the gain as 2 which is a ratio (10 mA/5 mA) of the second maximum driving current range of the reference actuator to the first maximum driving current range of the operating actuator 140. The gain adjustment unit 135 may multiply the first sensing signal generated by the current sensing unit 134 by 2 to convert the first sensing signal into the second sensing signal. The gain adjustment unit 135 may output the second sensing signal.

The error amplifier 132 may amplify an error between the second sensing signal output from the gain adjustment unit 135 and the analog control signal output from the digital-to-analog converter 131.

Specifically, when the second sensing signal output from the gain adjustment unit 135 is different from the analog control signal output from the digital-to-analog converter 131, the error amplifier 132 may amplify an error between the two signals and supply a voltage, which is required for the two signals to become identical, to the actuator driving circuit 133.

In an embodiment, the error amplifier 132 may calculate an error ratio between the analog control signal output from the digital-to-analog converter 131 and the second sensing signal output from the gain adjustment unit 135, multiply the analog control signal by a reciprocal of the error ratio, and output a value obtained by multiplication. In this case, the error ratio may be calculated as a ratio of the second sensing signal to the analog control signal.

The actuator driving circuit 133 generates a driving current for the operating actuator 140 on the basis of a signal output from the error amplifier 132. The actuator driving circuit 133 outputs the driving current to the operating actuator 140.

In the system 100 for driving an actuator according to the embodiment of the present disclosure, a step driving current of the actuator driving circuit 133 may be different from the step current of the digital-to-analog converter 131.

Specifically, the step current of the digital-to-analog converter 131 may be identical to the step driving current of the reference actuator. On the other hand, the step driving current of the actuator driving circuit 133 is the step driving current of the operating actuator 140 and may have a different value from the step current of the digital-to-analog converter 131 because the signal output from the digital-to-analog converter 131 is changed based on the signal to which the gain is reflected by the gain adjustment unit 135.

Figure 2A:
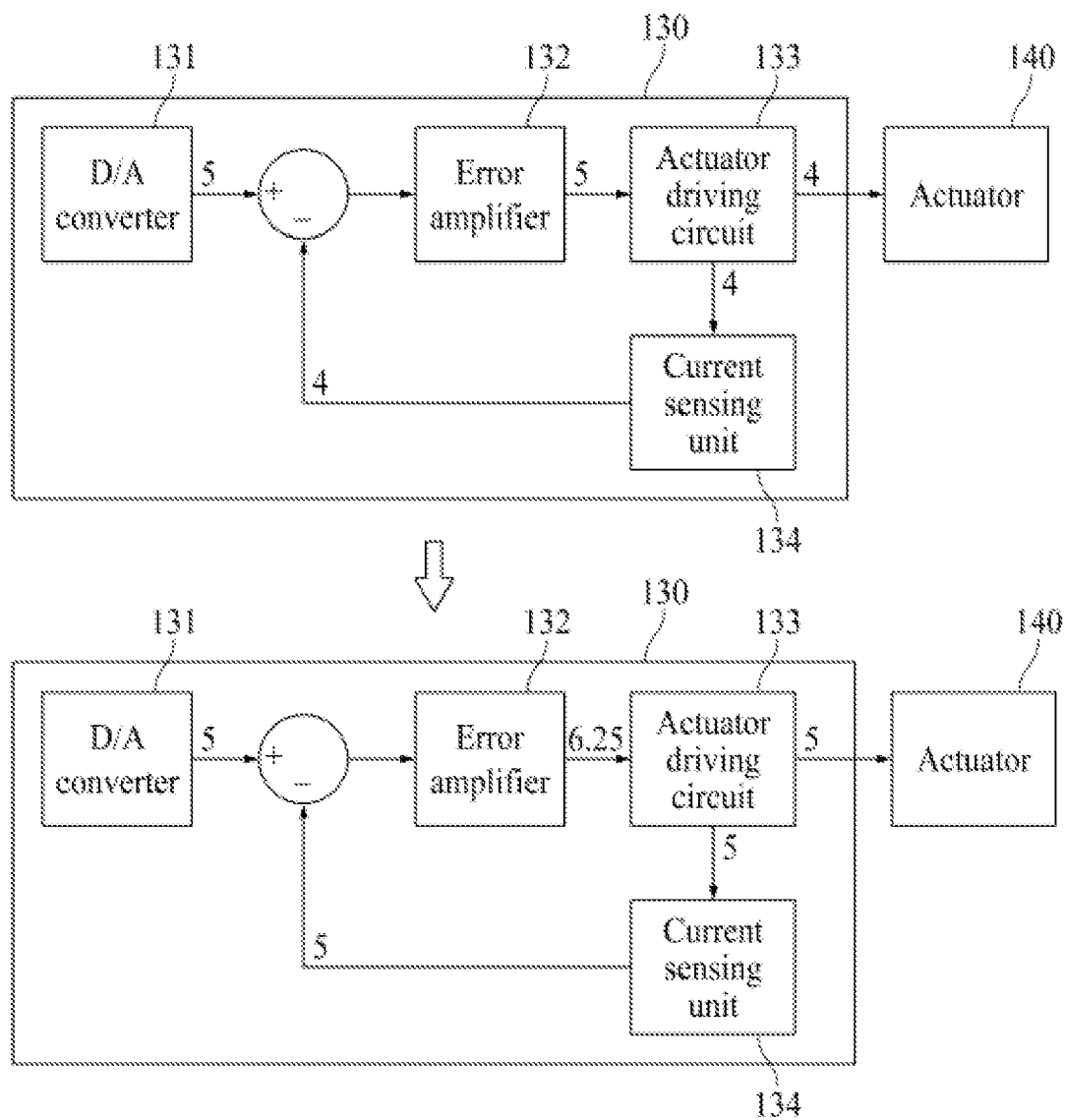
FIGS. 2A, 2B and 2C are diagrams illustrating examples of operation in a system for driving an actuator that does not include a gain adjustment unit.
Figure 2B:
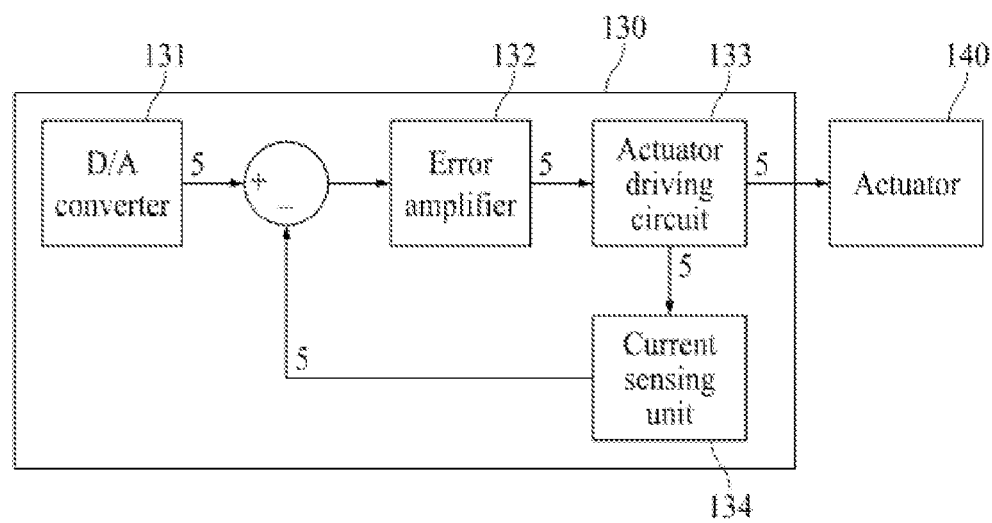
Figure 2C:
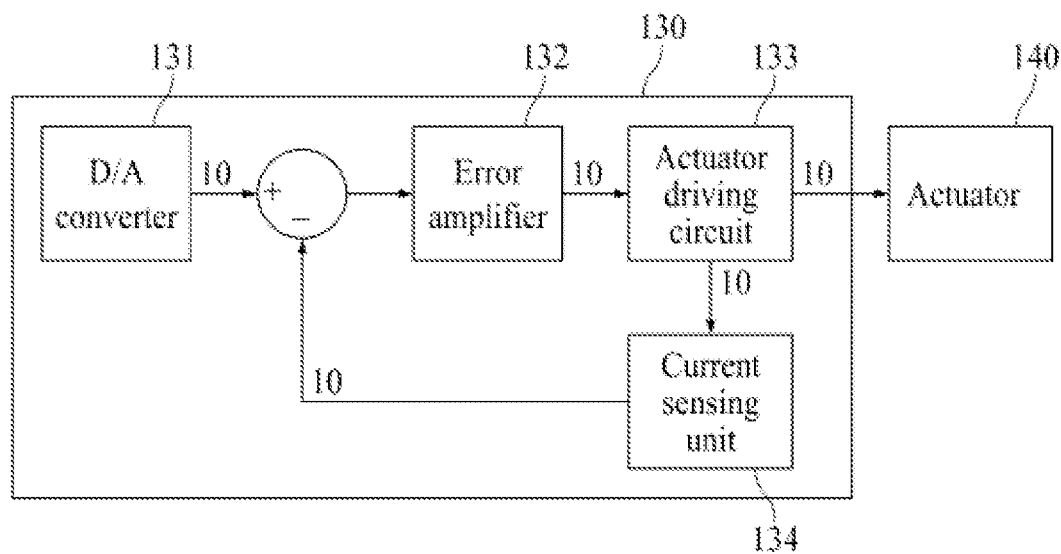
Figure 3:
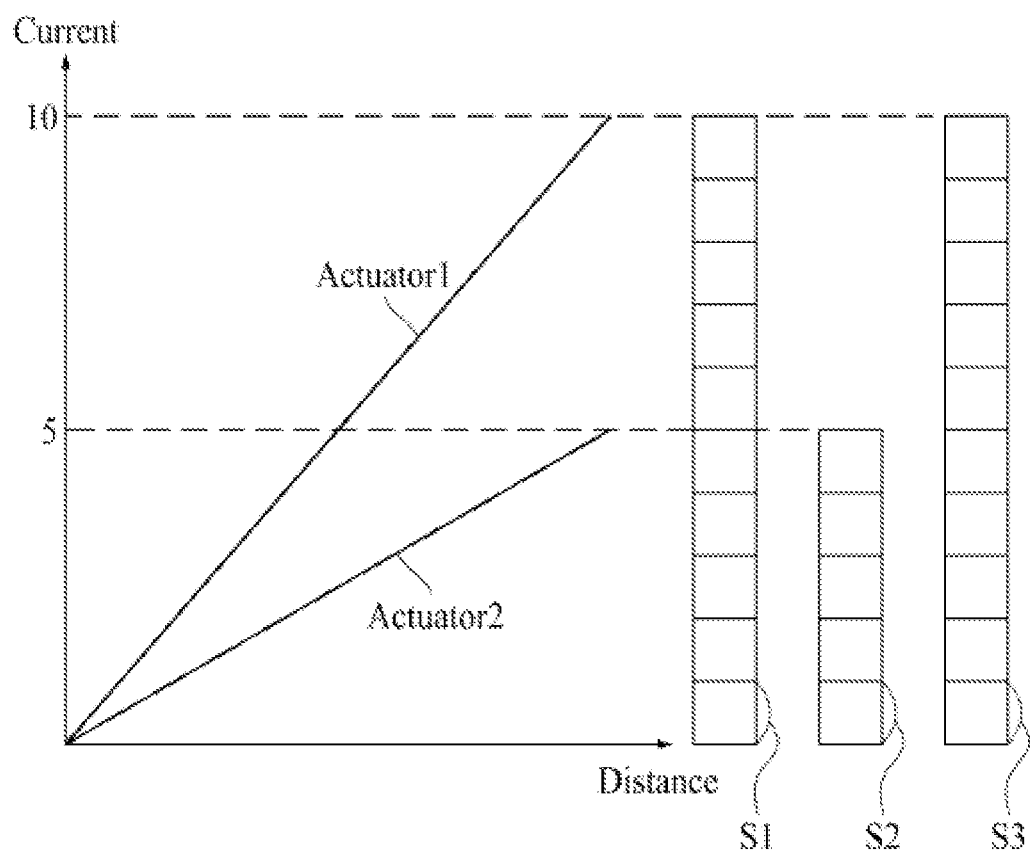
FIG. 3 is a graph showing the number of steps and a step driving current according to types of actuators in the system for driving an actuator that does not include the gain adjustment unit.

FIGS. 2A to 2C are diagrams illustrating examples of operation in a system for driving an actuator that does not include a gain adjustment unit, and FIG. 3 is a graph showing the number of steps and a step driving current according to types of actuators in the system for driving an actuator that does not include the gain adjustment unit.

Although signals which are output from a digital-to-analog converter 131, an error amplifier 132, and a current sensing unit 134, correspond to voltages, hereinafter, for convenience of description, current values will be described as a reference.

FIG. 2A illustrates an example of operation in the system 100 for driving an actuator when an error occurs between a signal output from the digital-to-analog converter 131 and a signal output from the current sensing unit 134.

For example, the digital-to-analog converter 131 may output a signal corresponding to 5 mA. When there is no signal output from the current sensing unit 134 or the signal output from the current sensing unit 134 is equal to 5 mA, the error amplifier 132 may output the signal corresponding to 5 mA. Accordingly, the actuator driving circuit 133 may output 5 mA to the actuator 140. The current sensing unit 134 may sense a current of an actuator 140 and the sensed current of the actuator 140 may be 4 mA, as illustrated in FIG. 2A.

The error amplifier 132 may amplify an error between the signal output from the digital-to-analog converter 131 and the signal output from the current sensing unit 134. Specifically, the signal output from the digital-to-analog converter 131 may correspond to 5 mA and the signal output from the current sensing unit 134 may correspond to 4 mA. In this case, the error amplifier 132 may calculate an error ratio between the signal output from the digital-to-analog converter 131 and the signal output from the current sensing unit 134 so that an output of the current sensing unit 134 becomes 5 mA, and the error amplifier 132 may multiply the signal output from the digital-to-analog converter 131 by an inverse number of the error ratio.

The error amplifier 132 may calculate the error ratio as 4/5 which is a ratio of 4 mA, which is an output of the current sensing unit 134, to 5 mA which is an output of the digital-to-analog converter 131. The error amplifier 132 may multiply 5 mA, which is the output of the digital-to-analog converter 131, by 5/4 which is an inverse number of the error ratio. Accordingly, the error amplifier 132 may output 6.25 mA to the actuator driving circuit 133.

The actuator driving circuit 133 may output 5 mA. The current sensing unit 134 may sense the current of the actuator 140 and the sensed current of the actuator 140 may be 5 mA. As a result, in the system 100 for driving an actuator, the signal output from the digital-to-analog converter 131 may become identical to the signal output from the current sensing unit 134 by the error amplifier 132.

FIGS. 2B and 2C illustrate examples of operation in the system 100 for driving an actuator when an error does not occur between the signal output from the digital-to-analog converter 131 and the signal output from the current sensing unit 134.

As an example, the digital-to-analog converter 131 may output a signal corresponding to 5 mA, as illustrated in FIG. 2B. When the signal output from the current sensing unit 134 is equal to 5 mA, the error amplifier 132 may output the signal corresponding to 5 mA. Accordingly, the actuator driving circuit 133 may output 5 mA to the actuator 140. The current sensing unit 134 may sense a current of the actuator 140 and the sensed current of the actuator 140 may be 5 mA, as illustrated in FIG. 2B.

As another example, the digital-to-analog converter 131 may output a signal corresponding to 10 mA, as illustrated in FIG. 2C. When the signal output from the current sensing unit 134 is equal to 10 mA, the error amplifier 132 may output the signal corresponding to 10 mA. Accordingly, the actuator driving circuit 133 may output 10 mA to the actuator 140. The current sensing unit 134 may sense the current of the actuator 140 and the sensed current of the actuator 140 may be 10 mA, as illustrated in FIG. 2C.

As illustrated in FIGS. 2B and 2C, in the system 100 for driving an actuator that does not include the gain adjustment unit 135, when there is no error between the signal output from the digital-to-analog converter 131 and the signal output from the current sensing unit 134, a value output from the digital-to-analog converter 131 is equal to a value output from the actuator driving circuit 133. That is, a step current of the digital-to-analog converter 131 is identical to a step driving current of the actuator driving circuit 133.

As a result, in the system 100 for driving an actuator that does not include the gain adjustment unit 135, it is possible to provide identical step driving currents S1 and S2 regardless of the type of the actuator 140, as illustrated in FIG. 3.

More specifically, a maximum driving current range of a first actuator Actuator1 may be different from that of a second actuator Actuator2. The first actuator Actuator1 may have a maximum driving current range of 10 mA and the second actuator Actuator2 may have a maximum driving current range of 5 mA smaller than that of the first actuator Actuator1.

Meanwhile, a step current S3 of the digital-to-analog converter 131 may be 1 mA, as illustrated in FIG. 3.

In the system 100 for driving an actuator that does not include the gain adjustment unit 135, the step current S3 of the digital-to-analog converter 131 is identical to the step driving current of the actuator 140, and thus the step driving current S1 of the first actuator Actuator1 may also be 1 mA. Since the maximum driving current range of the first actuator Actuator1 is 10 mA, the system 100 for driving an actuator that does not include the gain adjustment unit 135 may drive and control the first actuator Actuator1 in ten steps.

Meanwhile, in the system 100 for driving an actuator that does not include the gain adjustment unit 135, the step current S3 of the digital-to-analog converter 131 is identical to the step driving current of the actuator 140, and thus the step driving current S2 of the second actuator Actuator2 may also be 1 mA. Since the maximum driving current range of the second actuator Actuator2 is 5 mA, the system 100 for driving an actuator that does not include the gain adjustment unit 135 may drive and control the second actuator Actuator2 in five steps. That is, since the second actuator Actuator2 has the maximum driving current range smaller than that of the first actuator Actuator1, the number of steps, that is, the resolution, may be reduced. Accordingly, the performance of the system 100 for driving an actuator may be degraded.

Figure 4A:
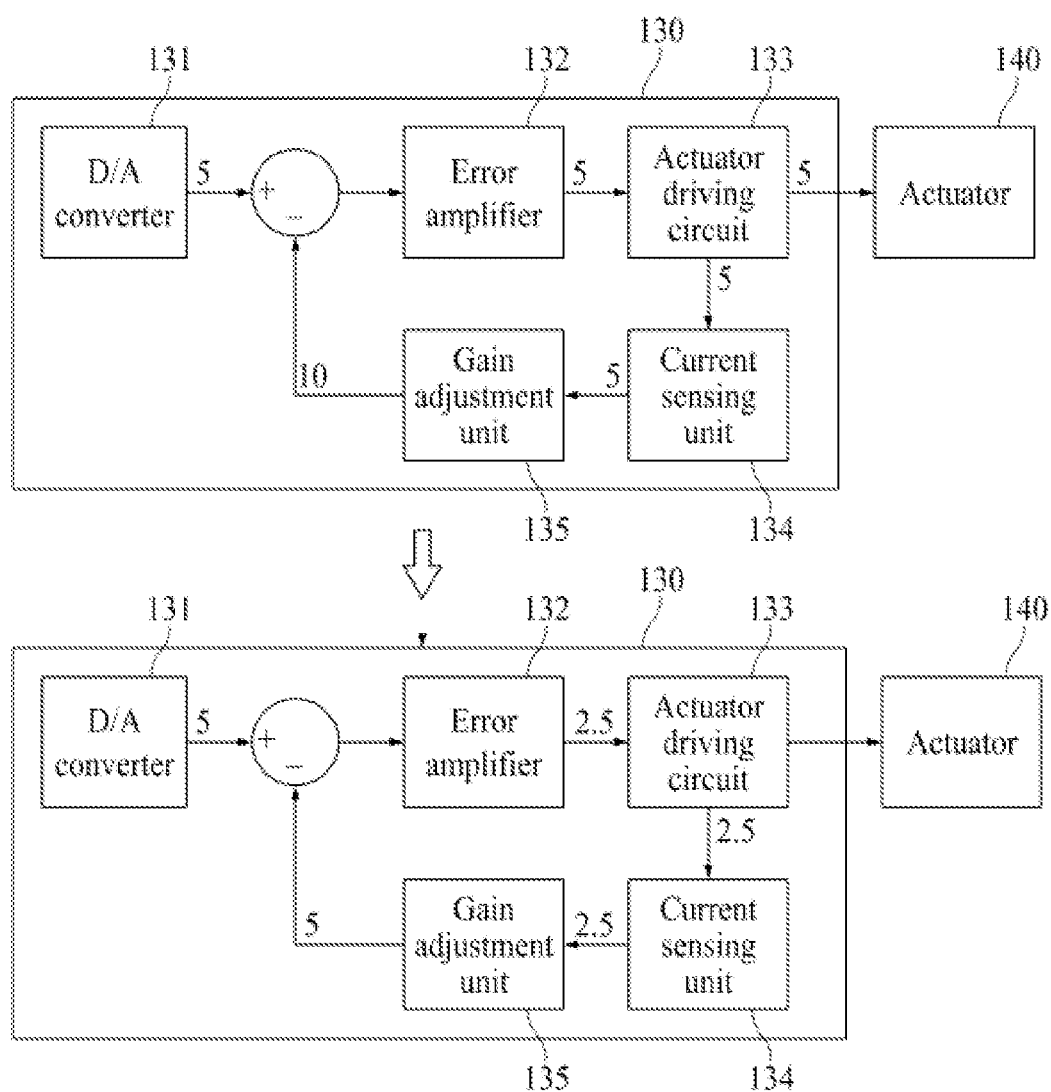
FIGS. 4A and 4B are diagrams illustrating examples of operation in a system for driving an actuator including a gain adjustment unit.
Figure 4B:
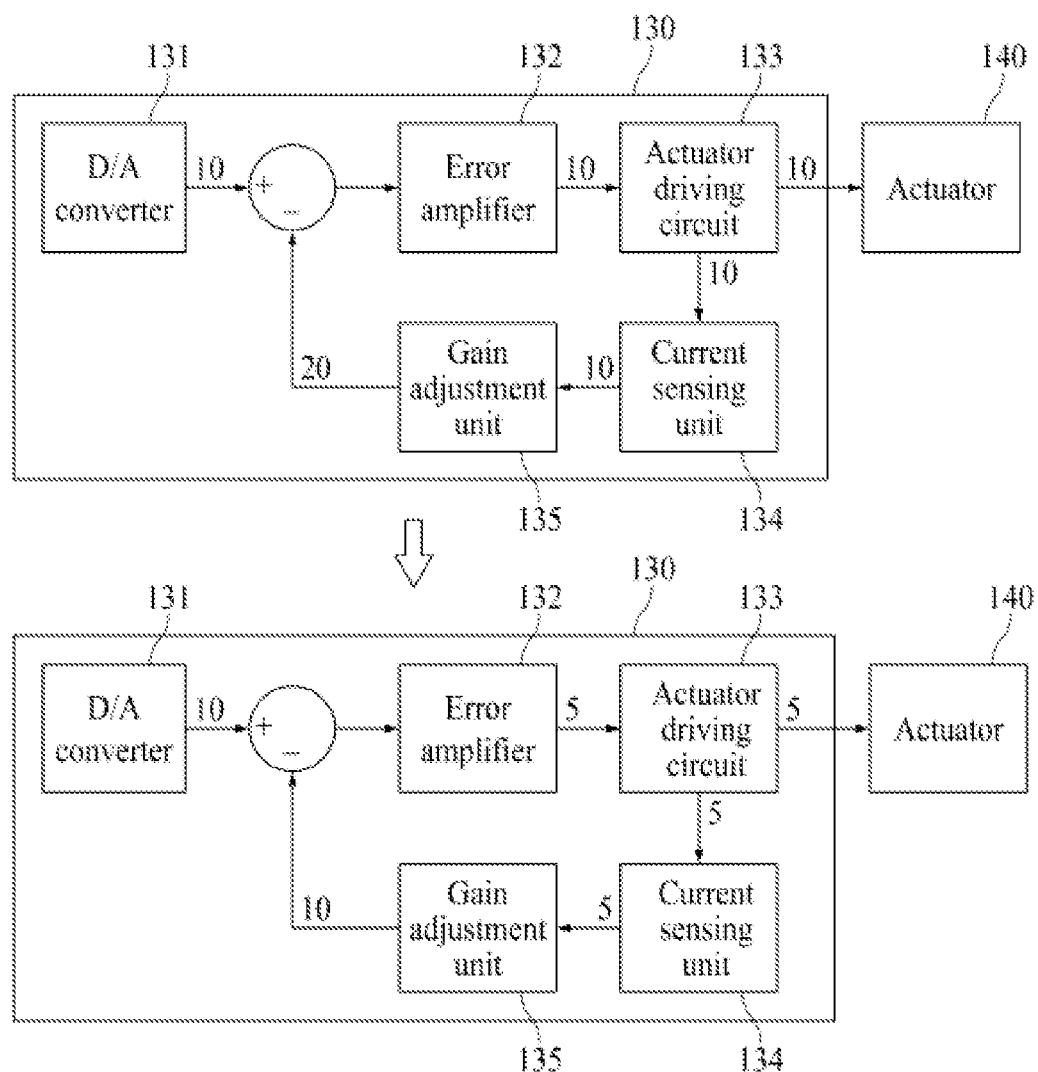
Figure 5:
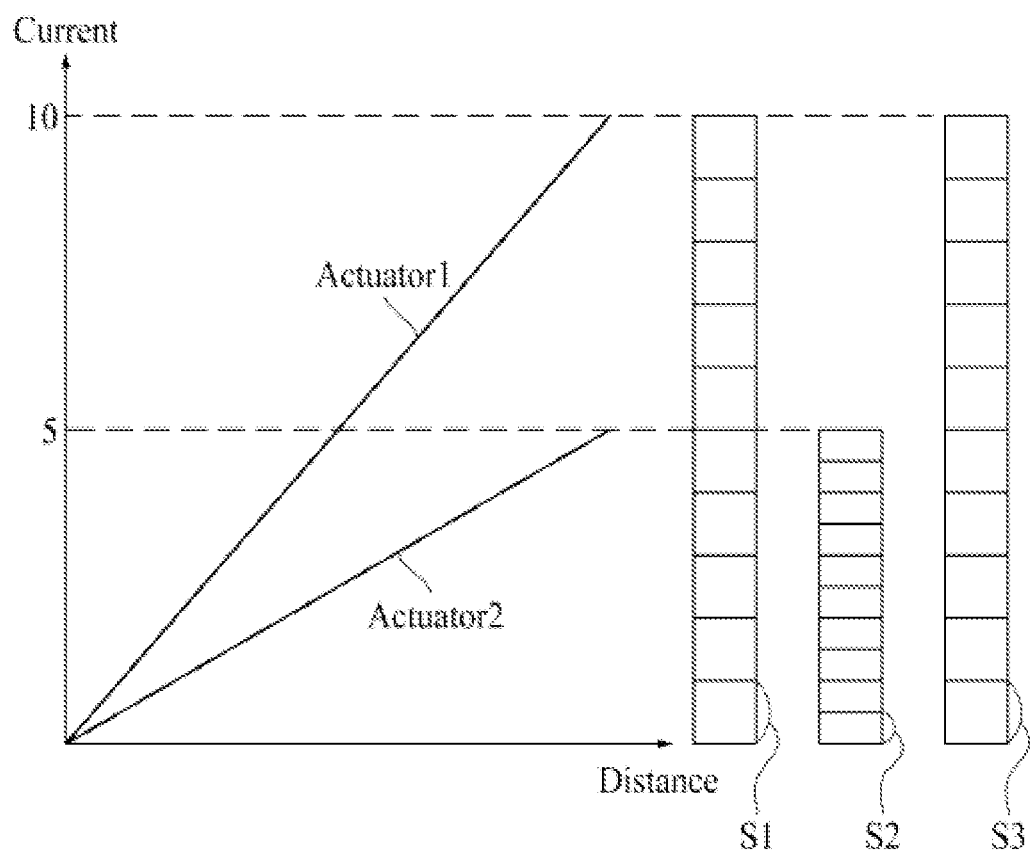
FIG. 5 is a graph showing the number of steps and a step driving current according to types of actuators in the system for driving an actuator including the gain adjustment unit.

FIGS. 4A and 4B are diagrams illustrating examples of operation in a system for driving an actuator including a gain adjustment unit, and FIG. 5 is a graph showing the number of steps and a step driving current according to types of actuators in the system for driving an actuator including the gain adjustment unit.

Although signals, which are output from a digital-to-analog converter 131, an error amplifier 132, a current sensing unit 134, and a gain adjustment unit 135, correspond to voltages, hereinafter, for convenience of description, current values will be described as a reference.

Further, for convenience of description, it is assumed that a reference actuator has a maximum driving current range of 10 mA and an operating actuator 140 has a maximum driving current range of 5 mA smaller than that of the reference actuator.

FIG. 4A illustrates an example of operation in the system 100 for driving an actuator including the gain adjustment unit 135 when the digital-to-analog converter 131 outputs a signal corresponding to 5 mA.

The digital-to-analog converter 131 may output a signal corresponding to 5 mA. When there is no signal output from the gain adjustment unit 135 or the signal output from the digital-to-analog converter 131 is equal to 5 mA, the error amplifier 132 may output the signal corresponding to 5 mA. Accordingly, the actuator driving circuit 133 may output 5 mA to the operating actuator 140. The current sensing unit 134 may sense a current of the operating actuator 140 and the sensed current of the operating actuator 140 may be 5 mA, as illustrated in FIG. 4A.

The gain adjustment unit 135 may multiply 5 mA, which is an output of the current sensing unit 134, by a gain. Specifically, the gain adjustment unit 135 may calculate the gain as 2 which is a ratio (10 mA/5 mA) of a second maximum driving current range of the reference actuator to a first maximum driving current range of the operating actuator 140. The gain adjustment unit 135 may output 10 mA obtained by multiplying 5 mA, which is the output of the current sensing unit 134, by 2.

The error amplifier 132 may amplify an error between a signal output from the digital-to-analog converter 131 and a signal output from the gain adjustment unit 135. Specifically, the signal output from the digital-to-analog converter 131 may correspond to 5 mA and the signal output from the gain adjustment unit 135 may correspond to 10 mA. In this case, the error amplifier 132 may calculate an error ratio between the signal output from the digital-to-analog converter 131 and the signal output from the gain adjustment unit 135 so that an output of the gain adjustment unit 135 becomes 5 mA, and the error amplifier 132 may multiply the signal output from the digital-to-analog converter 131 by an inverse number of the error ratio.

The error amplifier 132 may calculate the error ratio as 10/5 which is a ratio of 10 mA, which is an output of the gain adjustment unit 135, to 5 mA which is an output of the digital-to-analog converter 131. The error amplifier 132 may multiply 5 mA, which is the output of the digital-to-analog converter 131, by 5/10, which is an inverse number of the error ratio. Accordingly, the error amplifier 132 may output 2.5 mA to the actuator driving circuit 133.

The actuator driving circuit 133 may output 2.5 mA. The current sensing unit 134 may sense the current of the operating actuator 140 and the sensed current of the operating actuator 140 may be 2.5 mA. The gain adjustment unit 135 may multiply 2.5 mA, which is an output of the current sensing unit 134, by a gain. Specifically, the gain adjustment unit 135 may calculate the gain as 2 which is a ratio (10 mA/5 mA) of the second maximum driving current range of the reference actuator to the first maximum driving current range of the operating actuator 140. The gain adjustment unit 135 may output 5 mA obtained by multiplying 2.5 mA, which is the output of the current sensing unit 134, by 2.

As a result, in the system 100 for driving an actuator, the signal output from the digital-to-analog converter 131 may become identical to the signal output from the gain adjustment unit 135 by the error amplifier 132.

FIG. 4B illustrates an example of operation in the system 100 for driving an actuator including the gain adjustment unit 135 when the digital-to-analog converter 131 outputs a signal corresponding to 10 mA.

The digital-to-analog converter 131 may output a signal corresponding to 10 mA. When there is no signal output from the gain adjustment unit 135 or the signal output from the digital-to-analog converter 131 is equal to 10 mA, the error amplifier 132 may output the signal corresponding to 10 mA. Accordingly, the actuator driving circuit 133 may output 10 mA to the actuator 140. The current sensing unit 134 may sense a current of the operating actuator 140 and the sensed current of the operating actuator 140 may be 10 mA, as illustrated in FIG. 4B.

The gain adjustment unit 135 may multiply 10 mA, which is an output of the current sensing unit 134, by a gain. Specifically, the gain adjustment unit 135 may calculate the gain as 2 which is a ratio (10 mA/5 mA) of the second maximum driving current range of the reference actuator to the first maximum driving current range of the operating actuator 140. The gain adjustment unit 135 may output 20 mA obtained by multiplying 10 mA, which is the output of the current sensing unit 134, by 2.

The error amplifier 132 may amplify an error between a signal output from the digital-to-analog converter 131 and a signal output from the gain adjustment unit 135. Specifically, the signal output from the digital-to-analog converter 131 may correspond to 10 mA and the signal output from the gain adjustment unit 135 may correspond to 20 mA. In this case, the error amplifier 132 calculates an error ratio between the signal output from the digital-to-analog converter 131 and the signal output from the gain adjustment unit 135 so that an output of the gain adjustment unit 135 becomes 5 mA, and the error amplifier 132 may multiply the signal output from the digital-to-analog converter 131 by an inverse number of the error ratio.

The error amplifier 132 may calculate the error ratio as 20/10 which is a ratio of 20 mA, which is an output of the gain adjustment unit 135, to 10 mA which is an output of the digital-to-analog converter 131. The error amplifier 132 may multiply 10 mA, which is the output of the digital-to-analog converter 131, by 10/20 which is an inverse number of the error ratio. Accordingly, the error amplifier 132 may output 5 mA to the actuator driving circuit 133.

The actuator driving circuit 133 may output 5 mA. The current sensing unit 134 may sense the current of the operating actuator 140, and the sensed current of the operating actuator 140 may be 5 mA. The gain adjustment unit 135 may multiply 5 mA, which is an output of the current sensing unit 134, by a gain. Specifically, the gain adjustment unit 135 may calculate the gain as 2 which is a ratio (10 mA/5 mA) of the second maximum driving current range of the reference actuator to the first maximum driving current range of the operating actuator 140. The gain adjustment unit 135 may output 10 mA obtained by multiplying 5 mA, which is the output of the current sensing unit 134, by 2.

As a result, in the system 100 for driving an actuator, the signal output from the digital-to-analog converter 131 may become identical to the signal output from the gain adjustment unit 135 by the error amplifier 132.

As illustrated in FIGS. 4A and 4B, in the system 100 for driving an actuator including the gain adjustment unit 135, a value output from the digital-to-analog converter 131 may be different from a value output from the actuator driving circuit 133. That is, a step current of the digital-to-analog converter 131 may be different from a step driving current of the actuator driving circuit 133.

As a result, in the system 100 for driving an actuator including the gain adjustment unit 135, it is possible to provide a constant number of steps, that is, constant resolution, regardless of the type of the operating actuator 140, as illustrated in FIG. 5.

More specifically, a maximum driving current range of a first actuator Actuator1 may be different from that of a second actuator Actuator2. The first actuator Actuator1 may have a maximum driving current range of 10 mA and the second actuator Actuator2 may have a maximum driving current range of 5 mA smaller than that of the first actuator Actuator1.

Meanwhile, a step current S3 of the digital-to-analog converter 131 may be 1 mA, as illustrated in FIG. 5.

In the system 100 for driving an actuator including the gain adjustment unit 135, the step current S3 of the digital-to-analog converter 131 may be identical to a step driving current S1 of the first actuator Actuator1. When the maximum driving current range of the first actuator Actuator1 is identical to the maximum driving current range of the reference actuator, the gain adjustment unit 135 may calculate a gain as 1 which is a ratio (10 mA/10 mA) of the maximum driving current range of the reference actuator to the maximum driving current range of the first actuator Actuator1. The gain adjustment unit 135 may multiply a signal output from the current sensing unit 134 by 1 and output a value obtained by multiplication. When no other error occurs, the error amplifier 132 outputs the signal output from the digital-to-analog converter 131 to the actuator driving circuit 133.

As a result, the step driving current S1 of the first actuator Actuator1 may be identical to the step current S3 of the digital-to-analog converter 131 as illustrated in FIG. 5. Since the maximum driving current range of the first actuator Actuator1 is 10 mA, the system 100 for driving an actuator including the gain adjustment unit 135 may drive and control the first actuator Actuator1 in ten steps.

Meanwhile, in the system 100 for driving an actuator including the gain adjustment unit 135, the step current S3 of the digital-to-analog converter 131 may be different from a step driving current S2 of the second actuator Actuator2. When the maximum driving current range of the second actuator Actuator2 is different from the maximum driving current range of the reference actuator, the gain adjustment unit 135 may calculate the gain as 2 which is a ratio (10 mA/5 mA) of the maximum driving current range of the reference actuator to the maximum driving current range of the second actuator Actuator2. The gain adjustment unit 135 may multiply the signal output from the current sensing unit 134 by 2 and output a value obtained by multiplication.

The error amplifier 132 may calculate an error ratio between the signal output from the digital-to-analog converter 131 and the signal output from the gain adjustment unit 135. In general, when no other error occurs, the signal output from the gain adjustment unit 135 is doubled as the signal output from the digital-to-analog converter 131, and thus the error amplifier 132 may calculate the error ratio between the signal output from the digital-to-analog converter 131 and the signal output from the gain adjustment unit 135 as 2. The error amplifier 132 multiplies the signal output from the digital-to-analog converter 131 by ½, which is an inverse number of the error ratio, and outputs a value obtained by multiplication to the actuator driving circuit 133.

As a result, the step driving current S2 of the second actuator Actuator2 may be 0.5 mA, which is ½ of the step current S3 of the digital-to-analog converter 131, as illustrated in FIG. 5. Since the maximum driving current range of the second actuator Actuator2 is 5 mA, the system 100 for driving an actuator including the gain adjustment unit 135 may drive and control the second actuator Actuator2 in ten steps.

In the system 100 for driving an actuator including the gain adjustment unit 135, even when the maximum driving current range of the second actuator Actuator2 is smaller than the maximum driving current range of the first actuator Actuator1, the number of steps, that is, the resolution, may be constant. Accordingly, in the system 100 for driving an actuator including the gain adjustment unit 135, it is possible to provide constant resolution regardless of the type of the actuator 140 and prevent the occurrence of performance degradation due to resolution degradation.

According to the present disclosure, even when the maximum driving current range of the actuator is reduced, the resolution cannot be degraded. Accordingly, in the present disclosure, it is possible to prevent the occurrence of system performance degradation due to resolution degradation.

Further, in the present disclosure, it is possible to provide constant resolution regardless of the type of the actuator, and thus the present disclosure is compatible with various types of actuators having different maximum driving current ranges. Accordingly, in the present disclosure, the actuator can be changed freely and easily.

Further, the methods described in this specification may be implemented, at least in part, using one or more computer programs or components. The component may be provided as a series of computer instructions through computer-readable media or machine-readable media, including volatile and non-volatile memories. The instructions may be provided as software or firmware and may be implemented in whole or in part in hardware configurations such as application specific integrated circuits (ASICs), field-programmable gate arrays (FPGAs), digital signal processors (DSPs), or other similar devices. The instructions may be configured to be executed by one or more processors or other hardware components, and the processors or other hardware configurations, when executing the series of computer instructions, perform all or a part of the methods and procedures disclosed in this specification or enable the methods and procedures to be performed.

What is claimed is:

1. A system for driving an actuator, comprising:
    an actuator driving circuit configured to generate a driving current for an operating actuator and output the generated driving current to the operating actuator;
    a current sensing unit configured to sense a current of the operating actuator and generate a first sensing signal; and
    a gain adjustment unit configured to calculate a gain on the basis of a first maximum driving current range of the operating actuator and a second maximum driving current range of a reference actuator and convert the first sensing signal into a second sensing signal on the basis of the gain,
    wherein a signal generated based on the second sensing signal is input to the actuator driving circuit, and
    wherein the gain adjustment unit calculates a ratio of the second maximum driving current range to the first maximum driving current range as the gain.

2. The system for driving an actuator of claim 1, wherein the gain adjustment unit multiples the first sensing signal by the gain.

3. The system for driving an actuator of claim 1, further comprising:
    a digital-to-analog converter configured to convert a digital control signal for moving the operation actuator to a target position into an analog control signal and output the converted analog control signal; and
    an error amplifier configured to amplify an error between the second sensing signal output from the gain adjustment unit and the analog control signal output from the digital-to-analog converter.

4. The system for driving an actuator of claim 3, wherein the error amplifier calculates an error ratio between the analog control signal and the second sensing signal and multiplies the analog control signal by an inverse number of the error ratio.

5. The system for driving an actuator of claim 4, wherein the error amplifier calculates a ratio of the second sensing signal to the analog control signal as the error ratio.

6. The system for driving an actuator of claim 3, wherein a step driving current of the actuator driving circuit is different from a step current of the digital-to-analog converter.

7. The system for driving an actuator of claim 6, wherein the step driving current of the actuator driving circuit corresponds to a ratio of the step current of the digital-to-analog converter to the gain.

8. The system for driving an actuator of claim 1, wherein the operating actuator has the same resolution as the reference actuator.

9. A system for driving an actuator, comprising:
    a shaking detector configured to detect shaking and generate a detection signal;
    a controller configured to generate a control signal for moving an operating actuator to a target position on the basis of the detection signal; and
    a driver configured to adjust a driving current by a first step driving current according to the control signal and move the operating actuator to the target position,
    wherein the first step driving current is changed according to a first maximum driving current range of the operating actuator,
    wherein the driver includes a digital-to-analog converter configured to convert the control signal input from the controller into an analog voltage and output the converted analog voltage, and
    wherein the digital-to-analog converter outputs the analog voltage while increasing the analog voltage by a step current.

10. The system for driving an actuator of claim 9, wherein the driver determines the first step driving current of the operating actuator on the basis of a second maximum driving current range of a reference actuator, a second step driving current of the reference actuator, and the first maximum driving current range of the operating actuator.

11. The system for driving an actuator of claim 10, wherein the first step driving current of the operating actuator corresponds to a value obtained by multiplying the second step driving current by a ratio of the first maximum driving current range to the second maximum driving current range.

12. The system for driving an actuator of claim 9, wherein the driver further includes:
   a current sensing unit configured to sense a current of the operating actuator and generate a first sensing signal;
   a gain adjustment unit configured to calculate a gain on the basis of the first maximum driving current range of the operating actuator and a second maximum driving current range of the reference actuator and convert the first sensing signal into a second sensing signal on the basis of the gain;
   an error amplifier configured to amplify an error between the second sensing signal output from the gain adjustment unit and an analog control signal output from the digital-to-analog converter; and
   an actuator driving circuit configured to generate a driving current for the operating actuator on the basis of a signal output from the error amplifier and output the generated driving current to the operating actuator.

13. The system for driving an actuator of claim 12, wherein the gain adjustment unit calculates a ratio of the second maximum driving current range to the first maximum driving current range as the gain.

14. The system for driving an actuator of claim 12, wherein:
   the actuator driving circuit outputs the driving current while increasing the driving current by the first step driving current; and
   the first step driving current of the actuator driving circuit is different from the step current of the digital-to-analog converter.

15. The system for driving an actuator of claim 14, wherein the first step driving current of the actuator driving circuit corresponds to a ratio of the step current of the digital-to-analog converter to the gain.

16. The system for driving an actuator of claim 12, wherein the error amplifier calculates a ratio of the second sensing signal to the analog control signal as an error ratio and multiplies the analog voltage by an inverse number of the error ratio.

* * * * *